(12) United States Patent
Takizawa et al.

(10) Patent No.: US 7,080,560 B2
(45) Date of Patent: Jul. 25, 2006

(54) SEMICONDUCTOR PRESSURE SENSOR

(75) Inventors: Takashi Takizawa, Tokyo (JP); Tatsuo Suemasu, Tokyo (JP); Satoshi Yamamoto, Tokyo (JP)

(73) Assignee: Fujikura Ltd., Tokyo (JP)

( * ) Notice: Subject to any disclaimer, the term of this patent is extended or adjusted under 35 U.S.C. 154(b) by 56 days.

(21) Appl. No.: 10/714,639

(22) Filed: Nov. 18, 2003

(65) Prior Publication Data

US 2004/0103724 A1 Jun. 3, 2004

(30) Foreign Application Priority Data

Nov. 28, 2002 (JP) .......................... P2002-346053

(51) Int. Cl.
*G01L 9/00* (2006.01)
(52) U.S. Cl. .......................... 73/754; 73/753
(58) Field of Classification Search ........... 73/700–756
See application file for complete search history.

(56) References Cited

U.S. PATENT DOCUMENTS

| 4,439,752 | A | * | 3/1984 | Starr ............................... 338/2 |
| 5,291,788 | A | * | 3/1994 | Oohata et al. ................. 73/727 |
| 5,894,144 | A | * | 4/1999 | Mori et al. .................. 257/254 |
| 6,038,927 | A | * | 3/2000 | Karas .......................... 73/706 |
| 6,272,929 | B1 | * | 8/2001 | Kurtz et al. ................... 73/727 |
| 6,441,451 | B1 | * | 8/2002 | Ikeda et al. ................. 257/418 |
| 6,595,066 | B1 | * | 7/2003 | Kurtz et al. ................... 73/721 |
| 6,918,303 | B1 | * | 7/2005 | Casimiro et al. ............. 73/706 |

FOREIGN PATENT DOCUMENTS

JP 04-309831 2/1992

* cited by examiner

*Primary Examiner*—Edward Lefkowitz
*Assistant Examiner*—Jermaine Jenkins
(74) *Attorney, Agent, or Firm*—Sughrue Mion, PLLC

(57) ABSTRACT

The semiconductor pressure sensor includes a substrate (20). The sensor includes a diaphragm (26) implemented in the substrate (26) and being displaceable by a pressure medium acting on a side of the substrate (26). The sensor includes sensor circuitry (22, 23) implemented on the opposite side of the substrate in coincidence with the diaphragm (26) for detecting displacement of the diaphragm (26) for pressure.

59 Claims, 14 Drawing Sheets

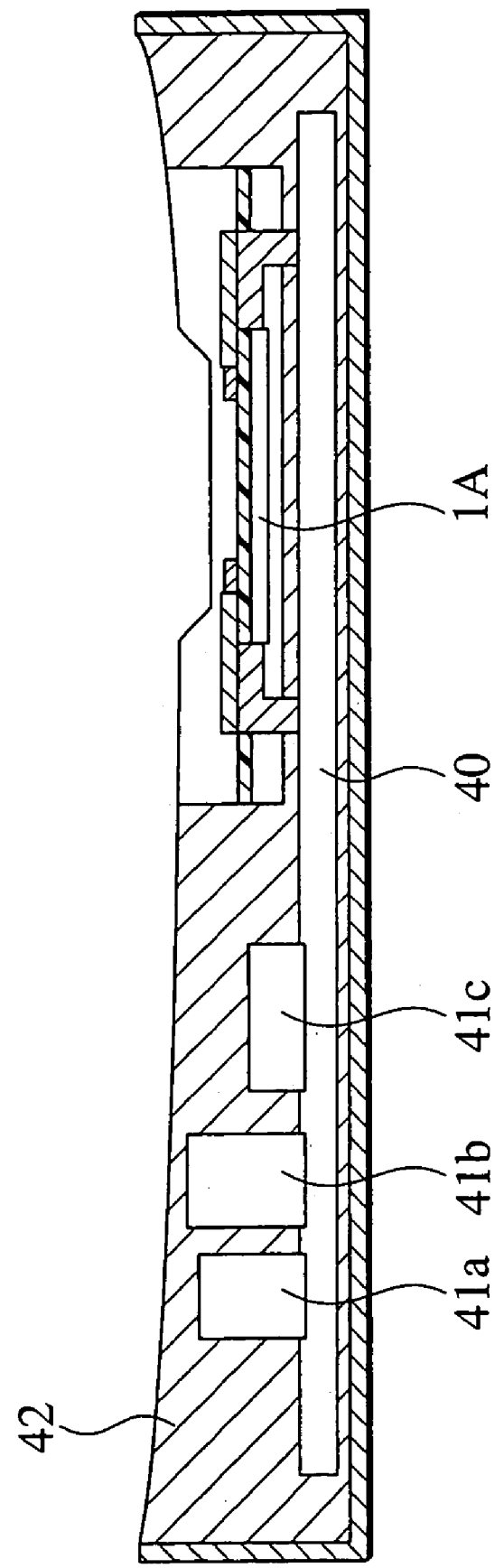

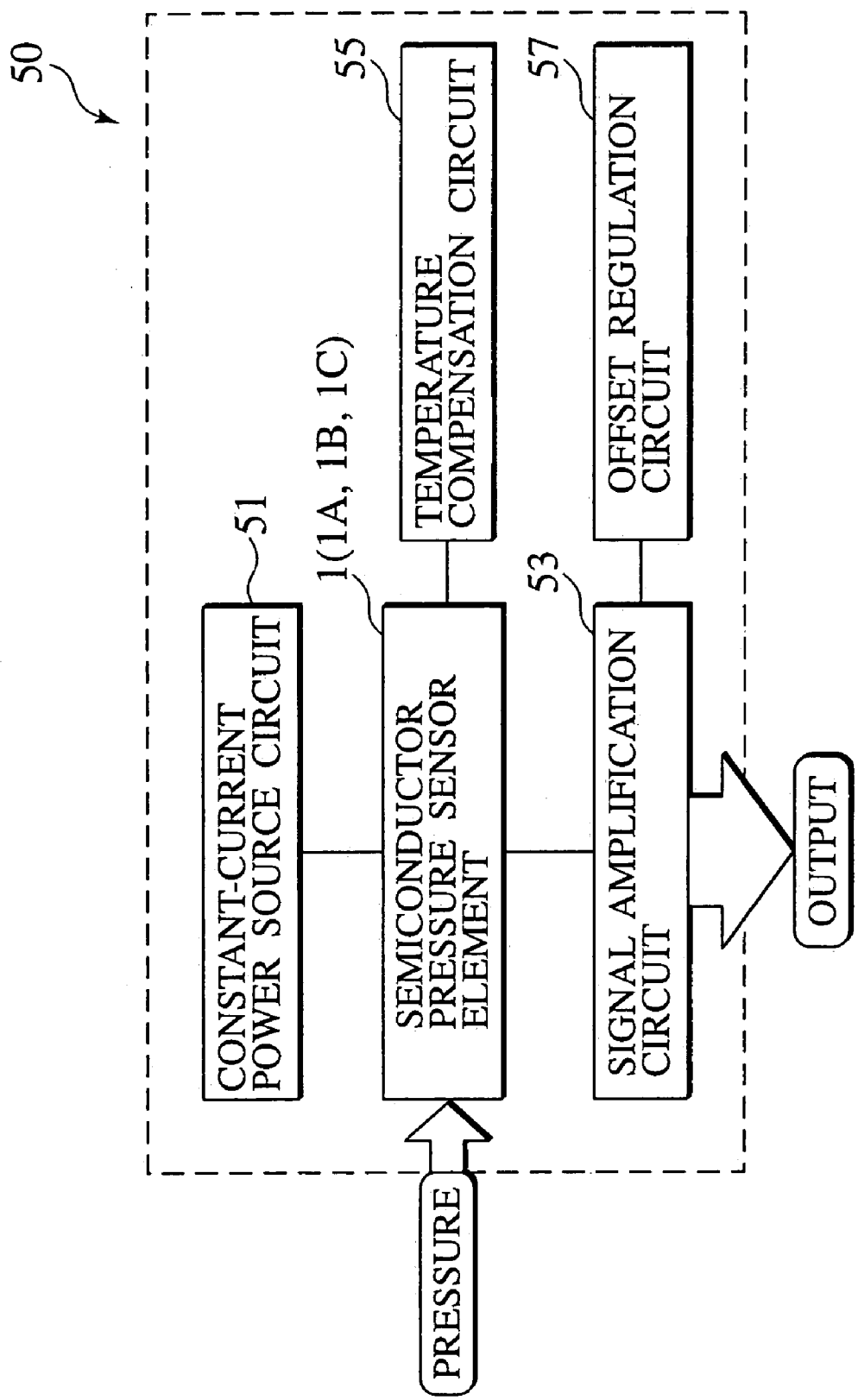

SEMICONDUCTOR PRESSURE SENSOR

CROSS-REFERENCE TO RELATED APPLICATION

This application claims the benefit of Japanese Patent Application P 2002-346053, filed Nov. 28, 2002 in the Japanese Patent Office, the entire disclosure of which is incorporated herein by reference.

BACKGROUND OF THE INVENTION

The present invention is related to a semiconductor pressure sensor, and particularly, related to the technique for improving the environmental endurance of a semiconductor pressure sensor.

In the prior art technique, semiconductor pressure sensors are known which make use of a pressure detecting device formed on a silicon chip for measuring pressure. For example, a semiconductor pressure sensor is described in Japanese Patent Publication No. 2,637,633. This semiconductor pressure sensor includes a silicon chip provided on a glass support with a pressure detecting device.

However, this pressure sensor's structure provides the pressure detecting device on the silicon chip, to which the pressure medium to be measured is applied when a pressure medium to be detected is introduced to the surface where an electrical circuit is formed. Accordingly, if the pressure medium includes undesirable moisture or ions, fluctuation of an output level due to surface current leakage on the silicon chip will occur, thus preventing correct pressure signals.

SUMMARY OF THE INVENTION

It is therefore an object of the present invention to provide a semiconductor pressure sensor having improved endurance against the pressure medium. It is another object of the present invention to provide a small sized and cheaper semiconductor pressure sensor.

A first aspect of the invention is directed to a semiconductor pressure sensor. The sensor includes a substrate. The sensor includes a diaphragm implemented in the substrate and being displaceable by a pressure medium acting on a side of the substrate. The sensor includes sensor circuitry implemented on the opposite side of the substrate in coincidence with the diaphragm for detecting displacement of the diaphragm for pressure.

The semiconductor pressure sensor may further include a support joined to the opposite side of the substrate. The support may be separated away from the sensor circuitry.

The sensor circuitry may include a piezo-resistive element.

The support may include a through-hole interconnection for deriving a signal from the sensor circuitry.

The substrate may include a through-hole interconnection for deriving a signal from the sensor circuitry.

The support may have a recess opposed to the sensor circuitry.

A second aspect of the invention is directed to a semiconductor pressure sensor. The sensor includes a support. The sensor includes a silicon chip joined to the support. The silicon chip includes a diaphragm displaceable under pressure. The silicon chip includes sensor circuitry including a piezo-resistive element variable, depending on displacement of the diaphragm. The sensor circuitry is formed on a side of the silicon chip. The side and the support are opposed to define a space therebetween.

The support may have a through-hole for deriving a signal from the sensor circuitry.

The silicon chip may have a through-hole for deriving a signal from the sensor circuitry.

The support may have a recess. The side may have an unetched flat surface. The recess and the flat surface may define a space therebetween.

According to the invention, the sensor circuitry is not exposed to a pressure medium. This allows the semiconductor pressure sensor to work reliably for a long time, if the pressure medium to be measured includes moisture or ions. The semiconductor pressure sensor improves endurance against the pressure medium, thus achieving high reliability.

BRIEF DESCRIPTION OF THE ACCOMPANYING DRAWINGS

FIGS. 1A and 1B are views showing the structure of a semiconductor pressure sensor in accordance with an exemplary first embodiment of the present invention, in which FIG. 1A is a cross sectional view and FIG. 1B is a bottom plan view;

FIG. 10 is an illustrative view of an example for implementing the semiconductor pressure sensor as shown in FIG. 1 on a heavy endurance requested pressure transponder for a tire pressure monitoring system;

FIG. 14 is a block diagram of an exemplary integrated pressure sensor; and

DETAILED DESCRIPTION OF EXEMPLARY EMBODIMENTS

Exemplary embodiments of the present invention will now be described with reference to the accompanying drawings. The described exemplary embodiments are intended to assist the understanding of the invention, and are not intended to limit the scope of the invention in any way. In the following, an absolute pressure sensor having piezo-resistive elements will be described as a semiconductor pressure sensor in accordance with the present invention.

First Embodiment

Figure 1A:
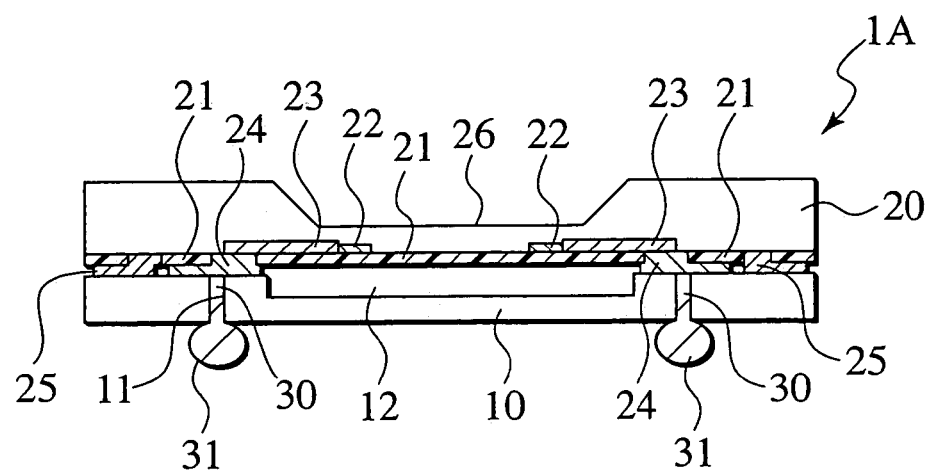
Figure 1B:
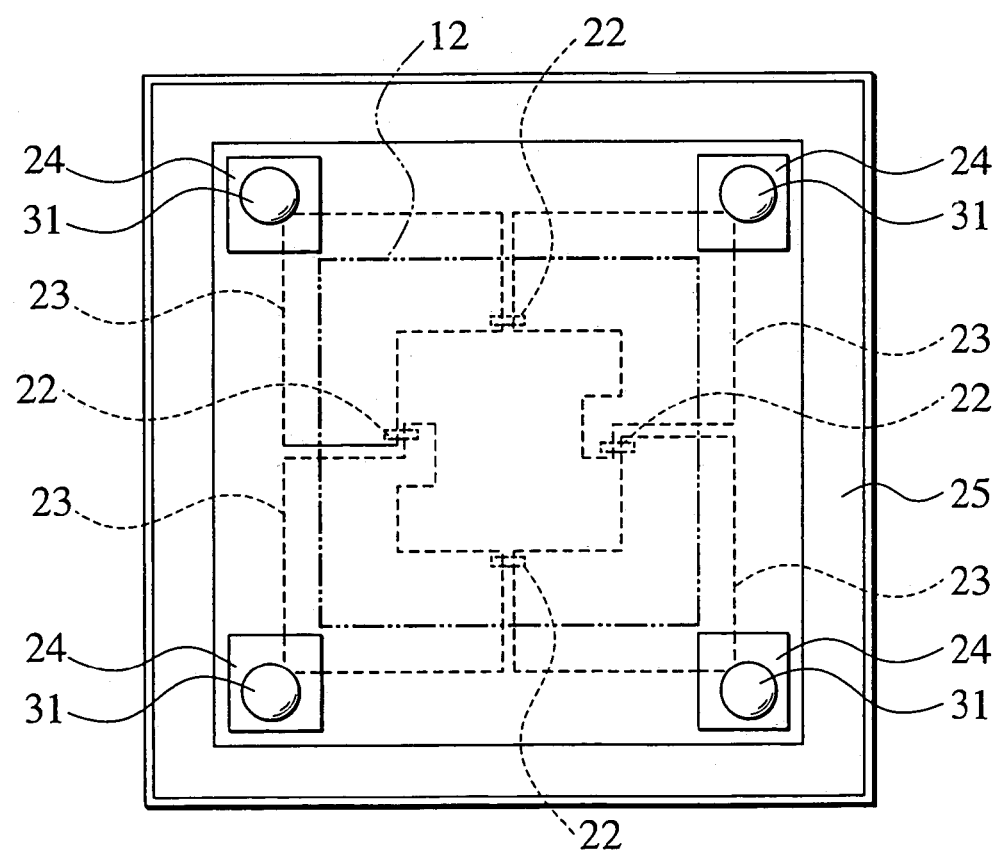

As illustrated in FIGS. 1A and 1B, this semiconductor pressure sensor 1A includes a glass support 10, a silicon chip 20 and through-hole interconnections 30.

The glass support 10 has through-holes 11 formed in the four corners. The glass support 10 has a recess 12 formed in the central portion.

The silicon chip 20 includes four piezo-resistive elements 22 and four high-concentration lead layers 23 as a sensor circuit, each of which is formed on the bottom surface (the lower surface as shown in FIG. 1). The piezo-resistive elements 22 and the high-concentration lead layers 23 are interposed between the insulation-film 21 and the bottom surface. The four piezo-resistive elements 22 are connected in series by the four high-concentration lead layers 23, forming a bridge circuit. A respective one of lead layers 23 is connected to a corresponding one of metal pads 24 which outputs the signals from the piezo-resistive elements 22 to an external circuit. The metal pads 24 are exposed at the bottom surface of the silicon chip 20. The silicon chip 20 includes a sealing metal 25 along the periphery of the bottom surface of the silicon chip 20 for enclosing the sensor circuit. The silicon chip 20 includes a thin diaphragm 26 on the upper surface of the silicon chip 20 (i.e., the upper portion in FIG. 1A). Diaphragm 26 is displaced in response to an applied pressure.

The respective piezo-resistive elements 22 are located on the diaphragm 26, and therefore the resistance values thereof change in accordance with the displacement of the diaphragm 26. The insulation-film 21, the piezo-resistive elements 22, the lead layers 23, the metal pads 24, the metal 25 and the diaphragm 26 function as a sensor circuit in combination.

As illustrated in FIG. 1A, the glass support 10 is formed with a recess 12. The silicon chip 20 has the bottom surface formed with the sensor circuit. The recess 12 and this bottom surface are located opposed to each other. The silicon chip 20 has an un-etched flat surface formed with the piezo-resistive elements 22. The flat surface and the recess 12 are located to define a spacing in-between. The glass support 10 is formed with through-holes 11. The silicon chip 20 and the glass support 10 are joined so that the metal pads 24 and the through-holes 11 coincide with each other, respectively.

The through-holes 11 are filled with a conductive material to form through-hole interconnections 30. The through-hole interconnections 30 protrude through the glass support 10. The through-hole interconnections 30 extend from the surface, at which the glass support 10 is joined with the silicon chip 20, to the opposite surface of the glass support 10. A respective one of through-hole interconnections 30 terminates in a corresponding one of bumps 31 on the opposite surface.

Figure 2A:
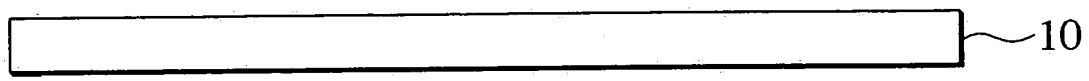
FIGS. 2A to 2C are illustrative views of the steps of manufacturing a glass support in an exemplary manufacturing method of the semiconductor pressure sensor shown in FIG. 1.
Figure 2B:
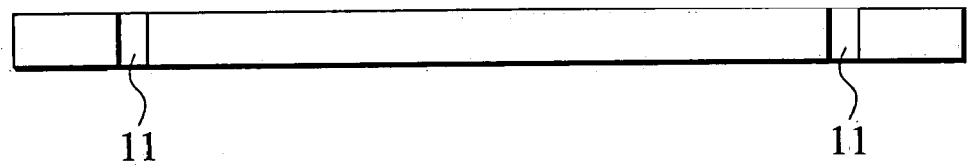
Figure 2C:
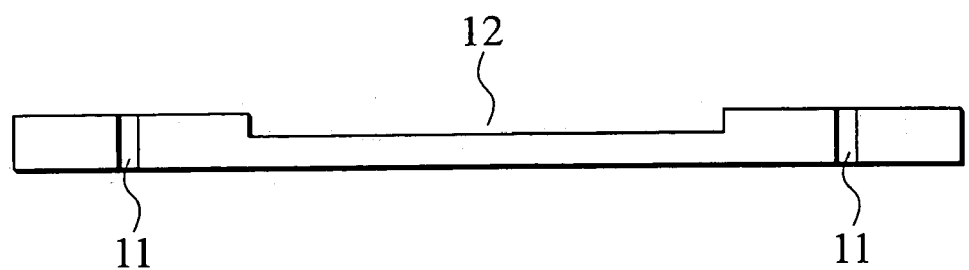

Next, the manufacturing method of the pressure sensor 1A will be described. First, the glass support 10 is manufactured. As illustrated in FIG. 2C, each of the chip locations of a glass wafer is formed with through-holes 11 and a recess 12 to form the glass support 10 in each location of the wafer, using a die forming technique. The through-holes 11 are positioned in coincidence with the metal pads 24 of the silicon chip 20 to be hereinafter described.

The through-holes 11 and the recess 12 can be formed by another appropriate technique other than a die forming technique. In this case, at the outset, the glass support 10 in a wafer is prepared, as shown in FIG. 2A. Next, as shown in FIG. 2B, through-holes 11 are formed through the glass support 10.

For example, a DRIE (Deep Reactive Ion Etching) method, a laser method, a microdrill method or a sandblasting method is applicable for forming the through-holes 11. The DRIE is ICP-RIE (Inductively Coupled Plasma—Reactive Ion Etching). The laser method is a method of forming holes by the use of a laser. The microdrill method is a method of forming holes by the use of a microdrill (micro diameter drill). The sandblasting method is a method of applying a sandblast of fine particles.

As illustrated in FIG. 2C, the glass support 10 is formed with the recess 12. This recess 12 is formed, using etching with hydrofluoric acid (HF), using a sandblasting method and so forth. The recess 12 prevents contact between the diaphragm 26 and the glass support 10 due to the displacement of the diaphragm 26 of the silicon chip 20. Accordingly, the recess 12 is arbitrarily formed, if necessary, where the diaphragm 26 could make contact with the glass support 10 depending upon the specification of the pressure sensor 1A.

Next, the manufacturing process of the silicon chip 20 is performed. In this process, a silicon wafer is fabricated therein with pressure sensors by an existing manufacturing method of piezo-resistive pressure sensors. The following explanation is made with reference to FIG. 3A to FIG. 3F.

Figure 3A:
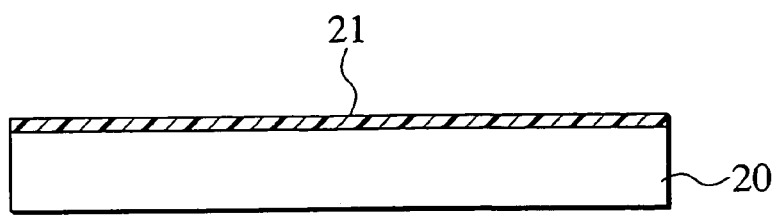
FIGS. 3A to 3F are illustrative views of the steps of manufacturing a silicon chip in an exemplary manufacturing method of the semiconductor pressure sensor shown in FIG. 1.

First, an n-type silicon wafer is prepared corresponding to the silicon chip 20. As illustrated in FIG. 3A, the surface of the silicon wafer is thermally oxidized, forming an insulation-film 21 of a silicon oxide film. Alternatively, the surface of the silicon wafer may be formed, using LPCVD (Low Pressure Chemical Vapor Deposition), with a silicon nitride film, in place of or in combination with the silicon oxide film as the insulation-film 21. The LPCVD is utilized in a case of forming a film by low-pressure vapor-phase growth with a reactive gas on a substrate to be processed.

Figure 3B:
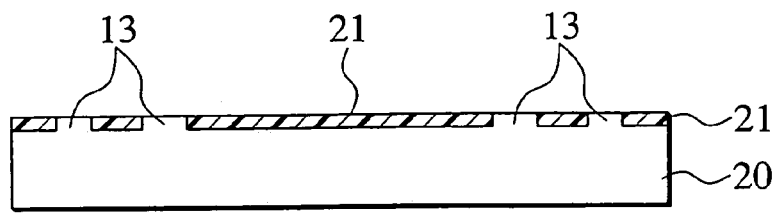
Figure 3C:
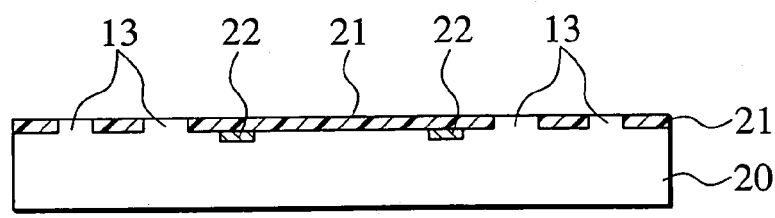
Figure 3D:
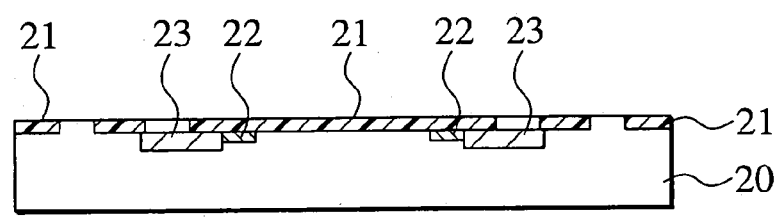

As illustrated in FIG. 3B, a photolithography step or an etching step allows the insulation-film 21 to be formed with openings 13 at the predetermined locations. As illustrated in FIG. 3C, the silicon wafer is formed with piezo-resistive elements 22, using the ion implantation (impurity implantation) or the diffusion of a p-type impurity such as boron. As illustrated in FIG. 3D, the silicon wafer is formed with high-concentration lead parts 23, using the diffusion of boron.

Figure 3E:
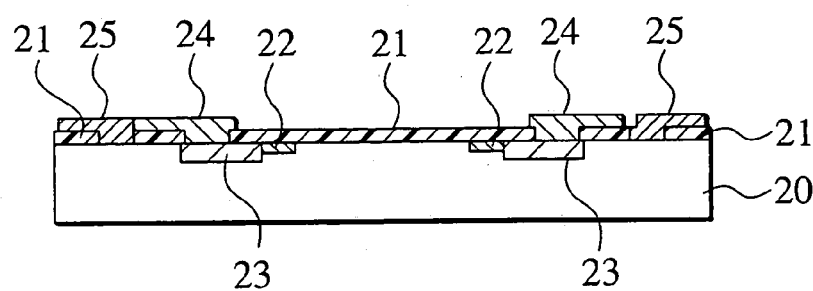

As illustrated in FIG. 3E, the silicon wafer is formed with the silicon metal pads 24 and a sealing metal 25, for example, using sputtering or vapor deposition of aluminum or an aluminum alloy. In either case, a photolithography technique is utilized for patterning.

Figure 3F:
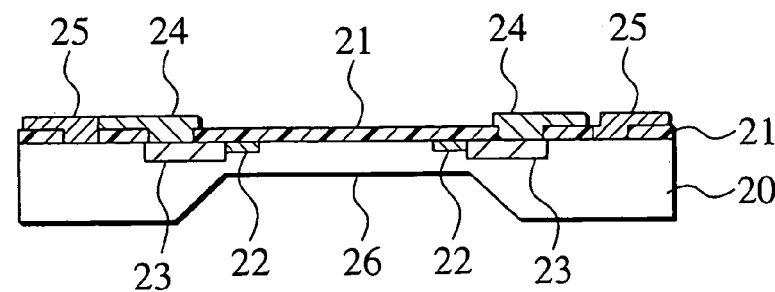

As illustrated in FIG. 3F, the silicon wafer is formed with a diaphragm 26 at the rear surface, using silicon anisotropic etching. The silicon anisotropic etching employs an inorganic water solution such as KOH or NaOH, or an organic water solution such as ethylenediamine pyro-catechol (EPD) or tetramethylammonium hydroxide (TMAH).

Figure 4:
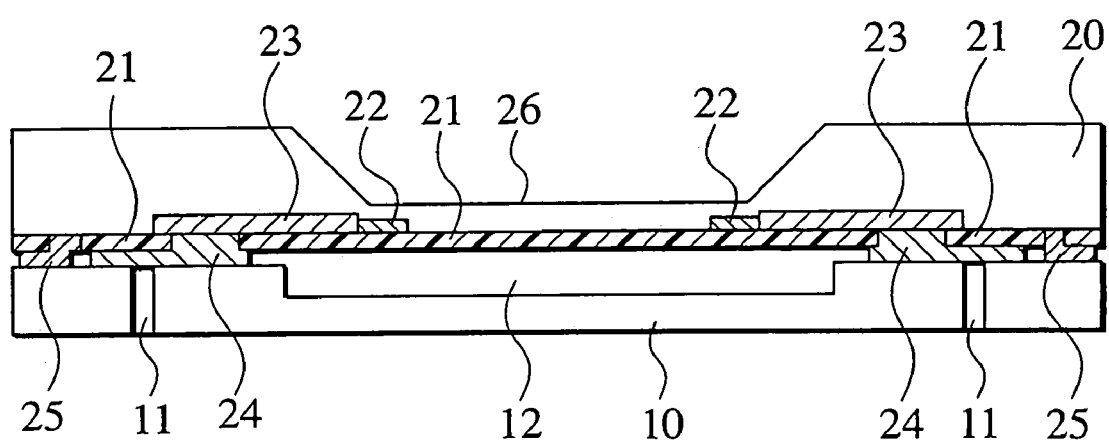
FIG. 4 is an illustrative view of the steps of joining a glass support and a silicon chip together in an exemplary manufacturing method of the semiconductor pressure sensor shown in FIG. 1.

The silicon chip 20 provided with the sensor circuit and the glass support 10 with the through-holes 11 are joined in a wafer-to-wafer fashion, using anodic bonding or the like. At this time, the respective silicon chip 20 and the glass support 10 are necessarily sealed therebetween to establish hermetic sealing. For this reason, the through-holes 11 of the glass support 10 and the metal pad 24 of the silicon chip 20 are required to coincide in position with each other as shown in FIG. 4. In order to facilitate the step of coincidence, the diameter of each metal pad 24 is formed larger in size than the corresponding through-hole 11.

Figure 5A:
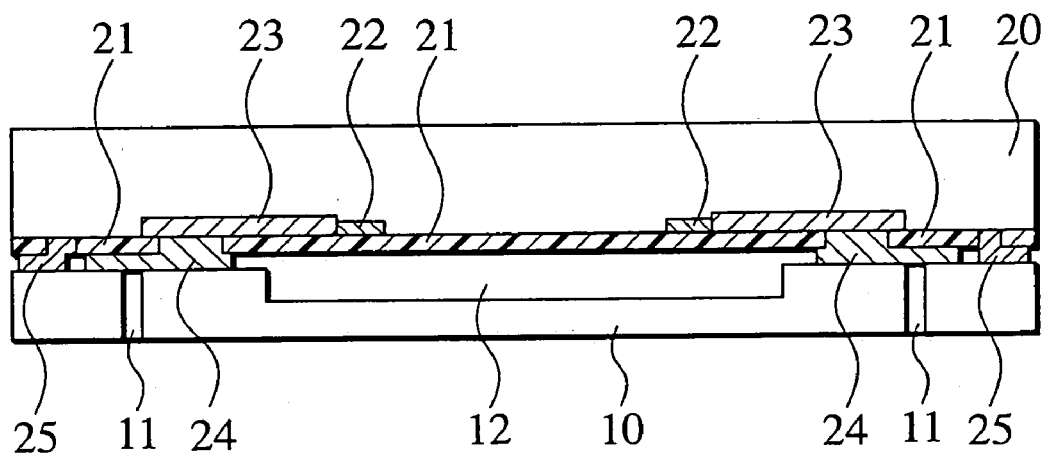
FIGS. 5A and 5B are illustrative views of another exemplary manufacturing method of the semiconductor pressure sensor shown in FIG. 1.
Figure 5B:
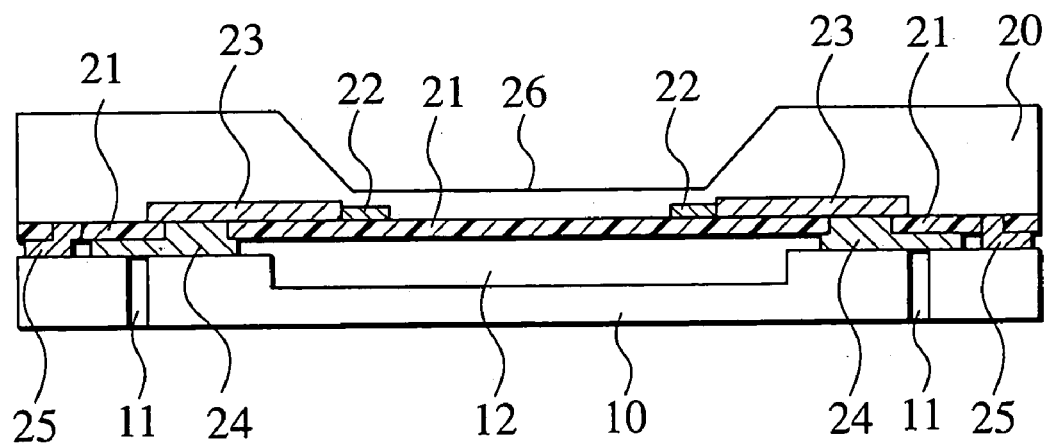

As illustrated in FIG. 5A, in the manufacturing process of the silicon chip 20, the glass support 10 and the silicon chip 20 may be joined in a wafer-to-wafer fashion by anodic bonding in advance of the formation of the diaphragm 26. Thereafter, as shown in FIG. 5B, the silicon chip 20 is formed with the diaphragm 26, using silicon anisotropic etching with an inorganic water solution such as KOH or NaOH, or an organic water solution such as ethylenediamine pyro-catechol (EPD) or tetramethylammonium hydroxide (TMAH).

Figure 6A:
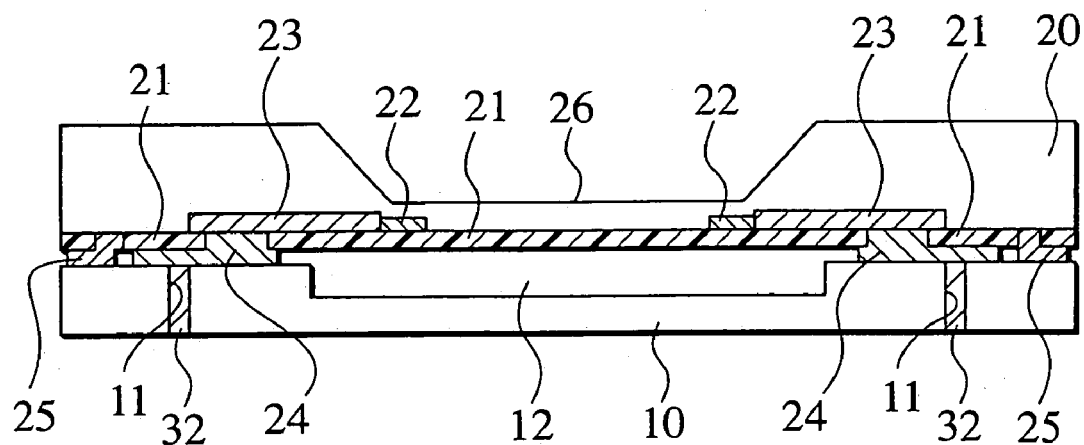
FIGS. 6A and 6B are illustrative views of the formation process of through-hole interconnections and bumps for terminals in an exemplary manufacturing method of the semiconductor pressure sensor as shown in FIG. 1.

As shown in FIG. 6A, the through-holes 11 are filled, by screen printing, with a conductive material 32, for example, a metal paste such as Cu paste or Ag paste, thus forming through-hole interconnections 30. For example, the through-holes 11 are filled with a solder or a metal having relatively a low melting point such as a lead tin solder, a gold tin solder, tin, indium and the like, using a molten metal suction method and the like.

Figure 6B:
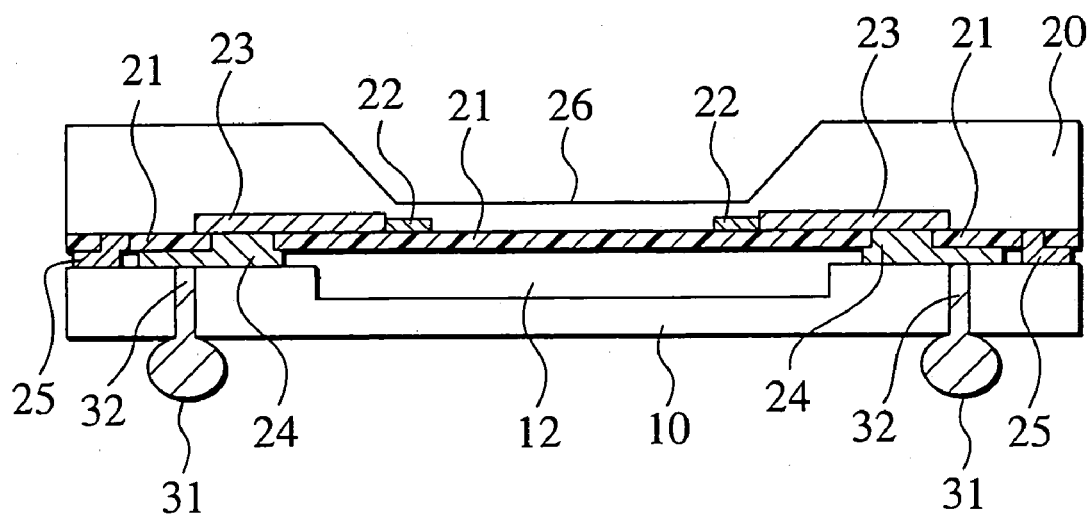

As shown in FIG. 6B, glass support 10 is formed with conductive bumps 31, if necessary. In case of using a molten metal suction method, the etched surface, after the formation of the diaphragm 26, is formed with a silicon oxide film, using thermal oxidation, plasma CVD and so forth. This oxide film serves to prevent a residual molten metal on the diaphragm 26.

The through-hole interconnections 30 may be formed, using sputtering or vapor deposition of a metallic film such as aluminum, gold or a gold/tin alloy or a conductive resin film on the inner wall of the holes. The through-hole interconnections 30 may be formed, using growing a thin metal film of nikel, copper or the like by electroless plating. Furthermore, a conductive material of nikel, copper or the like may be grown on the inner wall of the holes, using electrolytic plating with a metal film as an electric supply layer. The metal film has been formed, using sputtering, vacuum deposition or electroless plating.

The vacuum deposition method is a method of attaching and depositing a film on a substrate by evaporation of a substance from an evaporation source in vacuum. The sputtering method is a film formation method of ionizing an inert gas such as Ar, Ne introduced into a vacuum chamber, colliding the ions against a surface of a solid material, called a target, and ejecting atoms or molecules in neutral states to be deposited on a substrate. The plasma CVD technique is a method of plasmanizing a reactive gas, generating reactive radicals or ions to be chemical reacted under a reactive environment, and forming a film on a substrate at a low temperature.

Figure 7:
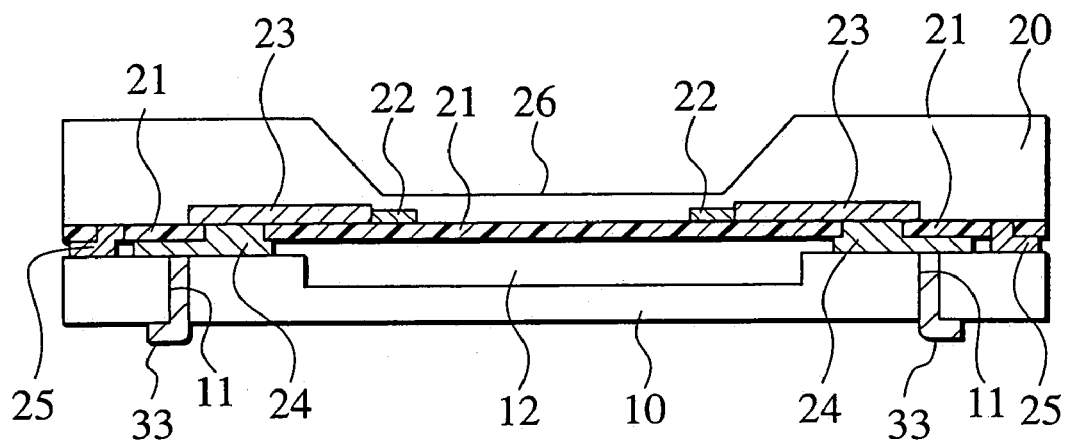
FIG. 7 is an illustrative view of an exemplary manufacturing method of a modified semiconductor pressure sensor from that shown in FIG. 1, where conductive pads are available instead of the bumps.
Figure 8:
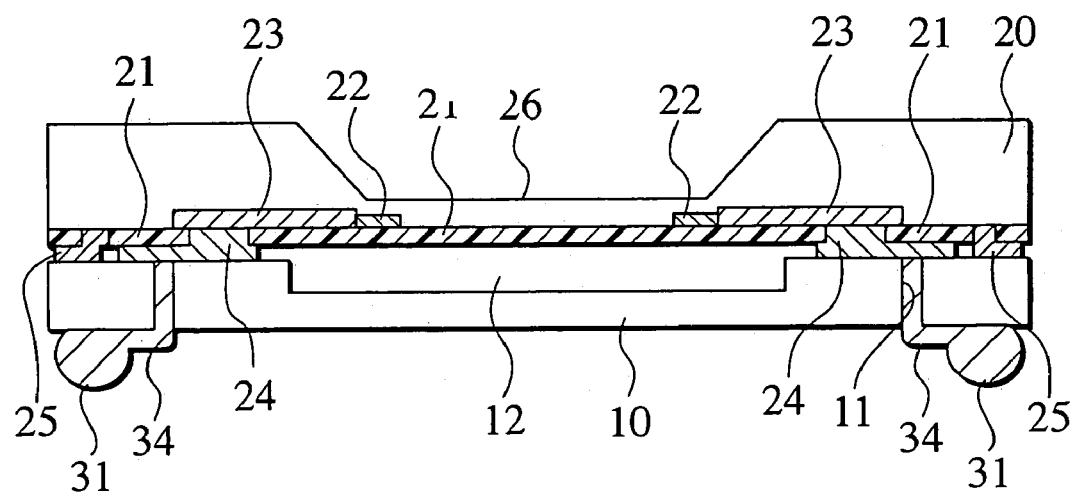
FIG. 8 is an illustrative view of an exemplary manufacturing method of a modified semiconductor pressure sensor from that shown in FIG. 1, where redistribution lines allow the bumps to be formed at positions other than positions of through-hole interconnections.

The conductive bumps 31 interconnect the sensor circuit on the silicon chip 20 and an external circuit with each other. Accordingly, the bumps 31 may be replaced by conductive pads 33 as shown in FIG. 7. As illustrated in FIG. 8, the forming of redistribution-lines 34 on the rear surface of the glass support 10 allows conductive bumps 31 or pads 33 to be positioned apart from the through-holes 11.

The materials of the conductive bumps 31, the pads 33 and the redistribution-lines 34 are selected from among a lead tin solder, a gold tin solder, aluminum, cupper, a cupper paste, a silver paste, a conductive resin film and the like in accordance with the material of the through-hole interconnections 30. A screen-printing method, a sputtering method, a vapor deposition method, a reflow process after screen-printing, an electroless plating process, and an electrolytic plating process are applicable to these materials.

The step of forming the through-hole interconnections 30 by insertion of a conductive material may be performed after joining the silicon chip 20 and the glass support 10 as shown in FIG. 5A and before forming the diaphragm 26 as shown in FIG. 5B. In accordance with this step, the conductive material is inserted before forming the mechanically brittle diaphragm 26. This reduces incidence of damage to the diaphragm 26, resulting in advantages in manufacture.

All the processing steps are performed with the glass support 10 and the silicon chip 20 in wafers. The joined wafers are cut into the respective devices by dicing or the like process, thus accomplishing products of the pressure sensor.

Figure 9A:
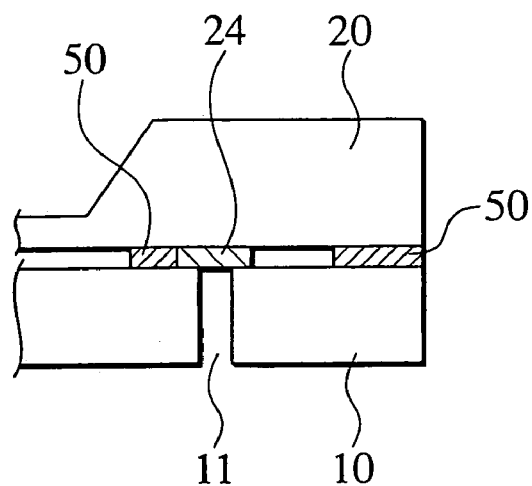
FIGS. 9A to 9D are illustrative views of a modified semiconductor pressure sensor from that shown in FIG. 1, where the glass support and a silicon chip are joined together an alternative fashion.
Figure 9C:
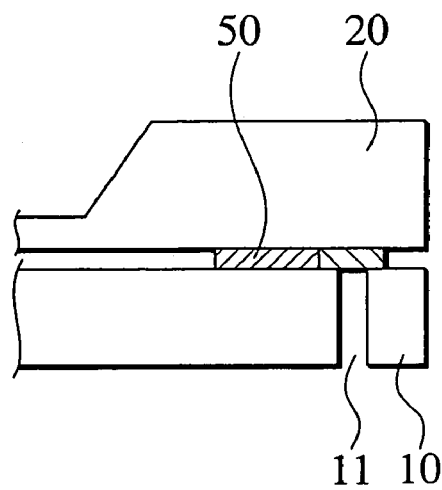
Figure 9B:
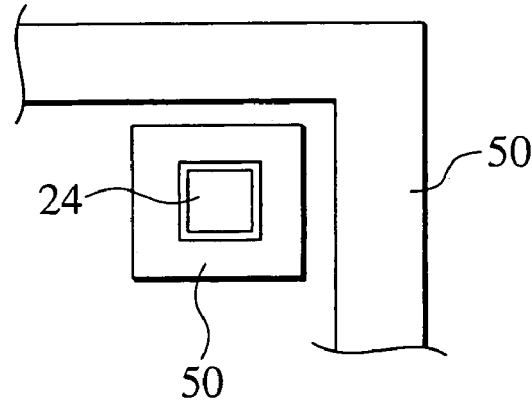
Figure 9D:
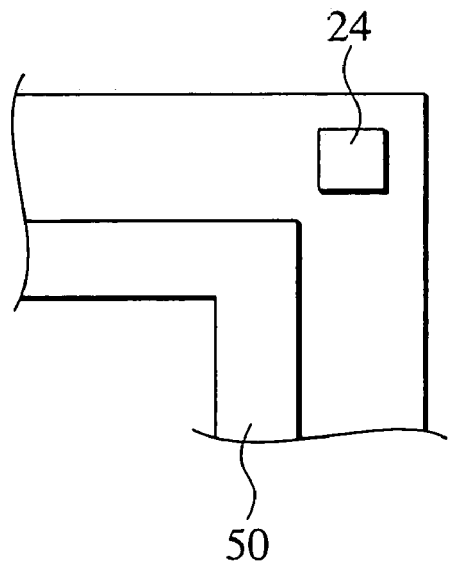

The silicon chip 20 and the glass support 10 are joined together, not only by anodic bonding, but also by making use of an adhesive 50 such as a low melting glass or a resin as in an example 1 shown in FIGS. 9A (Cross sectional view) and 9B (Bottom view) or in an example 2 shown in FIGS. 9C (Cross sectional view) and 9D (Bottom view). In this case, it is required to ensure a hermetic sealing between the silicon chip 20 and the glass support 10.

As shown in FIG. 10, the pressure sensor 1 is mounted upon a printed circuit board 40 together with other surface-mounted devices 41a, 41b and 41c, and a set of them 40, 41a, 41b and 41c are sealed with an epoxy resin 42. In this case, the hard epoxy resin is not attached to the upper surface of the diaphragm 26. The upper surface of the diaphragm 26 may be protected by means of a soft silicone if necessary. As a result, the pressure sensor 1 can be put to practical use under harsh environments, for example, as a pressure transponder for a tire pressure monitoring system.

Second Embodiment

The following describes a second exemplary embodiment of the invention. Like reference numbers indicate elements similar to those described in the first exemplary embodiment, and thereby redundant explanation is not repeated.

Figure 11A:
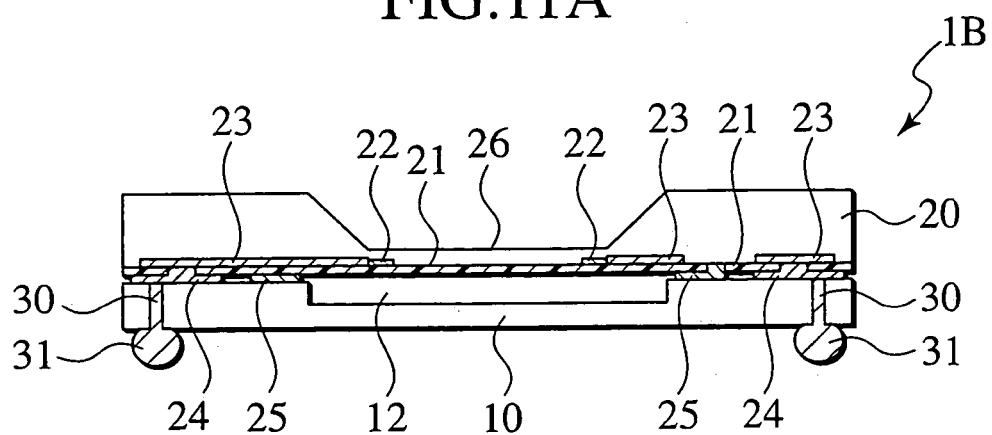
FIGS. 11A and 11B are views showing the structure of the semiconductor pressure sensor in accordance with an exemplary second embodiment of the present invention.
Figure 11B:
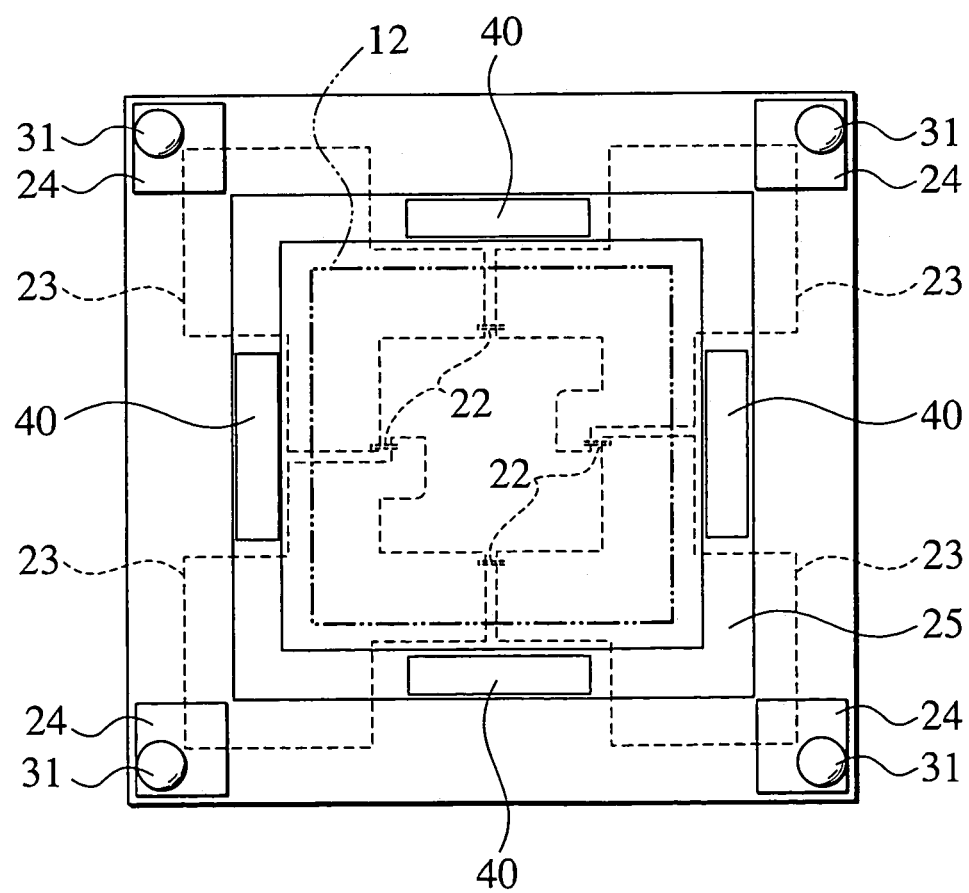

In the case of a semiconductor pressure sensor 1B, a sealing metal 25 is formed inside of a metal pad 24 as shown in FIG. 11A and FIG. 11B. When the glass support 10 is anodic bonded to the silicon chip 20, the sealing metal 25 is required to electrically connect with a silicon substrate. For this reason, the sealing metal 25 is joined to the silicon substrate with joints 40 where no high-concentration lead parts 23 are formed.

It is possible that joints 40 have recesses lower than other locations where an insulation-film 21 is removed. Accordingly, it is desirable to form a thin insulation-film 21 for secure hermeticity, even if a recess is produced during bonding. In either joining method, attention should be paid to recesses of joints for secure hermeticity.

As explained above, the pressure sensor 1B of the second embodiment facilitates the manufacturing method of the pressure sensor, because hermeticity is not required during joining of the through-hole interconnections 30 and the metal pad 24 with each other.

Third Embodiment

The following describes a third exemplary embodiment of the invention. Like reference numbers indicate elements similar to those described in the first exemplary embodiment, and thereby redundant explanation is not repeated.

Figure 12:
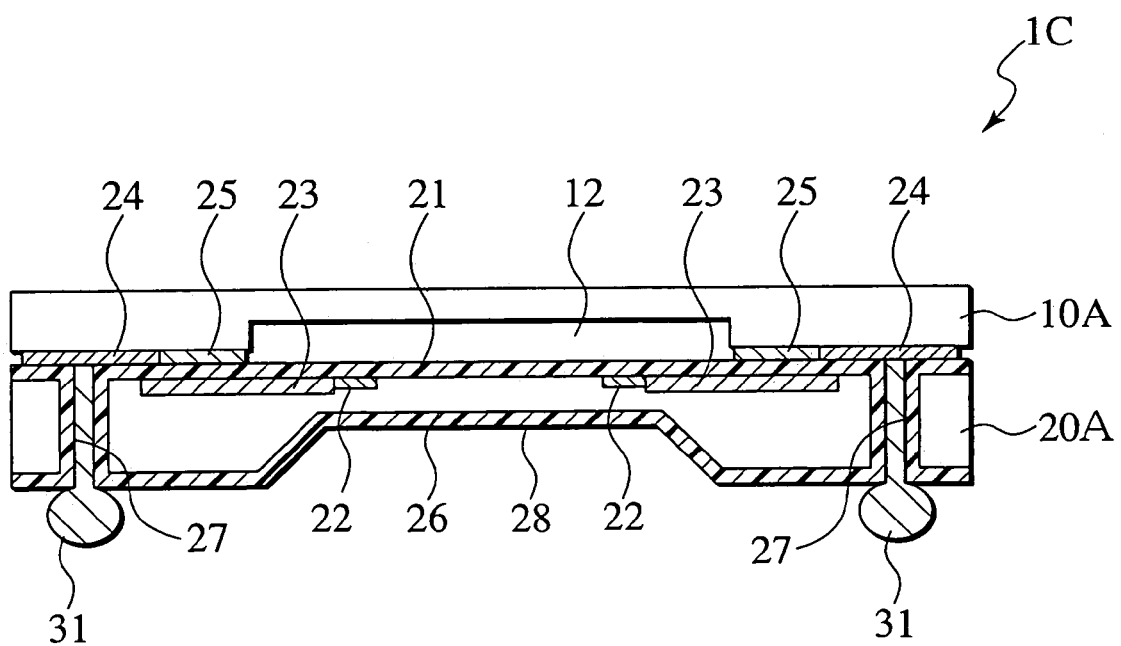
FIG. 12 is a view showing the structure of the semiconductor pressure sensor in accordance with a third exemplary embodiment of the present invention.

A semiconductor pressure sensor 1C of the third exemplary embodiment is different from the pressure sensor 1A of the first exemplary embodiment in that a silicon chip 20 has through-holes 27 therethrough as shown in FIG. 12.

The manufacturing method of this pressure sensor 1C will be described with reference to FIGS. 13A to 13D.

Figure 13A:
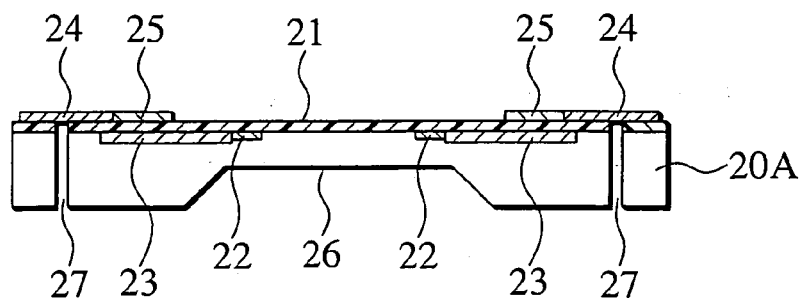
FIGS. 13A to 13D are illustrative views of an exemplary manufacturing method for manufacturing the semiconductor pressure sensor shown in FIG. 12.

A glass support 10A is prepared without through-holes 11. Next, a silicon wafer is prepared, with silicon chip 20 formed with sensor circuit of FIG. 3A, as the manufacturing process of the first embodiment. As illustrated in FIG. 13A, the silicon chip 20A has through-holes 27 therethrough from the rear surface (i.e., the surface with no sensor circuit). A DRIE method such as the ICP-RIE method is employed for the formation of the through-holes 27.

Figure 13B:
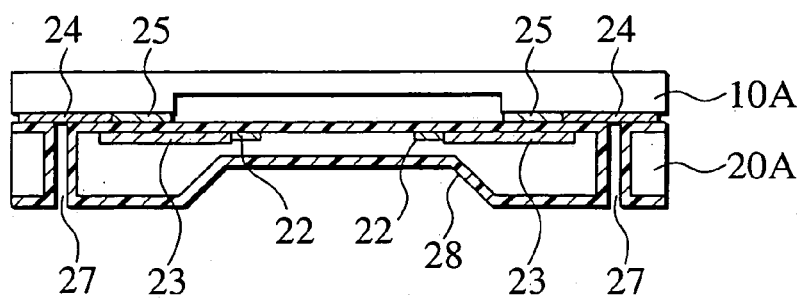

As illustrated in FIG. 13B, an insulation-film 28 is formed on the inner walls of the through-holes 27 and the etched surface of the diaphragm 26, using plasma CVD or the like. As illustrated in FIG. 13B, the fabricated silicon chip 20A and the glass support 10A are joined to each other in a wafer-to-wafer fashion, using anodic bonding. In this case, the silicon chip 20A and the glass support 10A are joined to establish an air hermeticity therebetween.

Figure 13C:
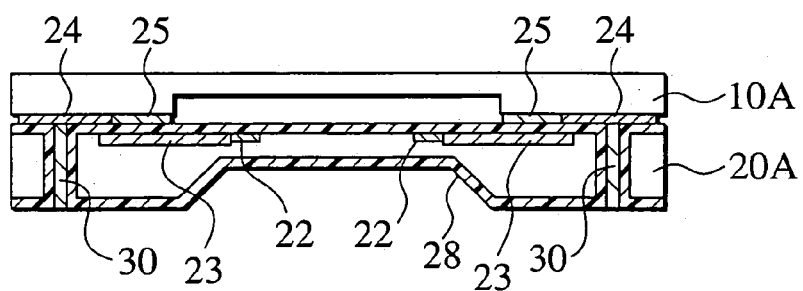
Figure 13D:
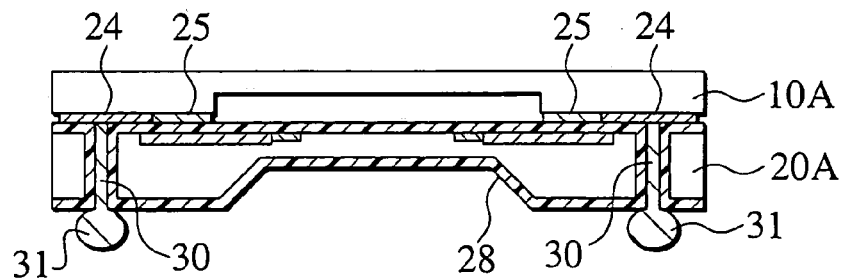

As illustrated in FIG. 13C, the through-holes 27 are filled with a conductive material, using a screen printing method or a molten metal suction method, thus forming through-hole interconnections 30. Alternatively, the inner walls of the through-holes 27 are formed with a film of a conductive material, using sputtering, vacuum deposition, electroless plating or the like. Next, the conductive material is grown, using electrolytic plating with the metal film as an electric supply layer formed by sputtering, vacuum deposition or electroless plating, thus forming through-hole interconnections 30. Silicon chip 20 is formed with conductive bumps 31, if necessary, as shown in FIG. 13D.

Alternatively, the diaphragm 26 may be formed after the joining of the glass support 10A and the silicon chip 20A to each other in a wafer-to-wafer fashion. Also, the formation of the diaphragm 26 may be performed after the filling of the through-holes 27 with a conductive material or after the growing of the conductive material.

As explained above, in accordance with the pressure sensors of the first through third embodiments of the present invention, the joining of the glass support 10 and the sealing metal 25 of the silicon chip 20 to each other allows the sealing of the sensor circuit with the piezo-resistive elements 22 and the high-concentration lead parts 23. This allows the sensor circuit not to be exposed to a pressure medium to be measured. Accordingly, the pressure medium to be measured does not directly contact with the surface formed with the sensor circuit. Thus, a long life operation is possible without loss of reliability, even if the pressure medium for measurement includes undesirable moisture or ions. Namely, it is possible to provide a pressure sensor showing improved endurance against a pressure medium for measurement together with high reliability.

The bumps 31 for connection with an external circuit allow the pressure sensor itself to be mounted on a printed circuit board. No prior metal cap or mold package is required as a package for the pressure sensor. Accordingly, it is possible to provide a smaller sized and cheaper pressure sensor.

Still further, output signals are derived from the sensor circuit through the through-hole interconnections 30, and the pressure medium to be measured comes into contact only with the surface formed with the sensor circuit. Thus, the pressure sensor having this structure is achieved at a lower cost.

In the above embodiments, the formation of the through-holes 11 and the through-holes 27 is achieved, using a DRIE method, a microdrill method, a sandblasting method, a die forming technique or the like. The filling of the through-holes 11 and the through-holes 27 with the conductive material is achieved using a screen printing method, a molten metal suction method or the like. The formation of conductive films of aluminum, gold, a gold/tin alloy, copper, a conductive resin film and so forth on the inner walls of the through-holes 11 and the through-holes 27 is achieved using sputtering, vapor deposition or plating. The formation of diaphragm 26 is achieved using silicon anisotropic etching with an inorganic water solution such as KOH or NaOH, or an organic water solution such as ethylenediamine pyrocatechol (EPD) or tetramethylammonium hydroxide (TMAH). The joining of the silicon chip 20 or 20A and the glass support 10 or 10A is achieved, using anodic bonding, adhesive bonding with the adhesive layer 50 such as a low melting glass or the like bonding method. Thus, it is possible to flexibly design an appropriate manufacturing process of the pressure sensor in combination with these methods.

The through-hole interconnections 30 may be formed through either the glass support 10 or the silicon chip 20A. This allows flexible selection from appropriate implemented embodiments in accordance with the applications of the pressure sensor.

Furthermore, the deriving of output signals through the through-hole interconnections 30 allows arbitrary determination from any type of terminal. Namely, an arbitrary terminal structure is selected from among the conductive bumps 31, the conductive pads 33 and redistribution-lines 34 which are surface mountable, depending upon the implementation design. This allows flexible implementation.

In FIG. 14, the pressure sensors 1A, 1B, 1C are adapted for a one-chip integrated pressure sensor 50. The integrated pressure sensor 50 includes a pressure sensor device 1 (1A, 1B, 1C). The pressure sensor 50 includes a constant current power source circuit 51, a signal amplification circuit 53, a temperature compensation circuit 55, and an offset regulation circuit 57 as peripheral circuitry.

Figure 15:
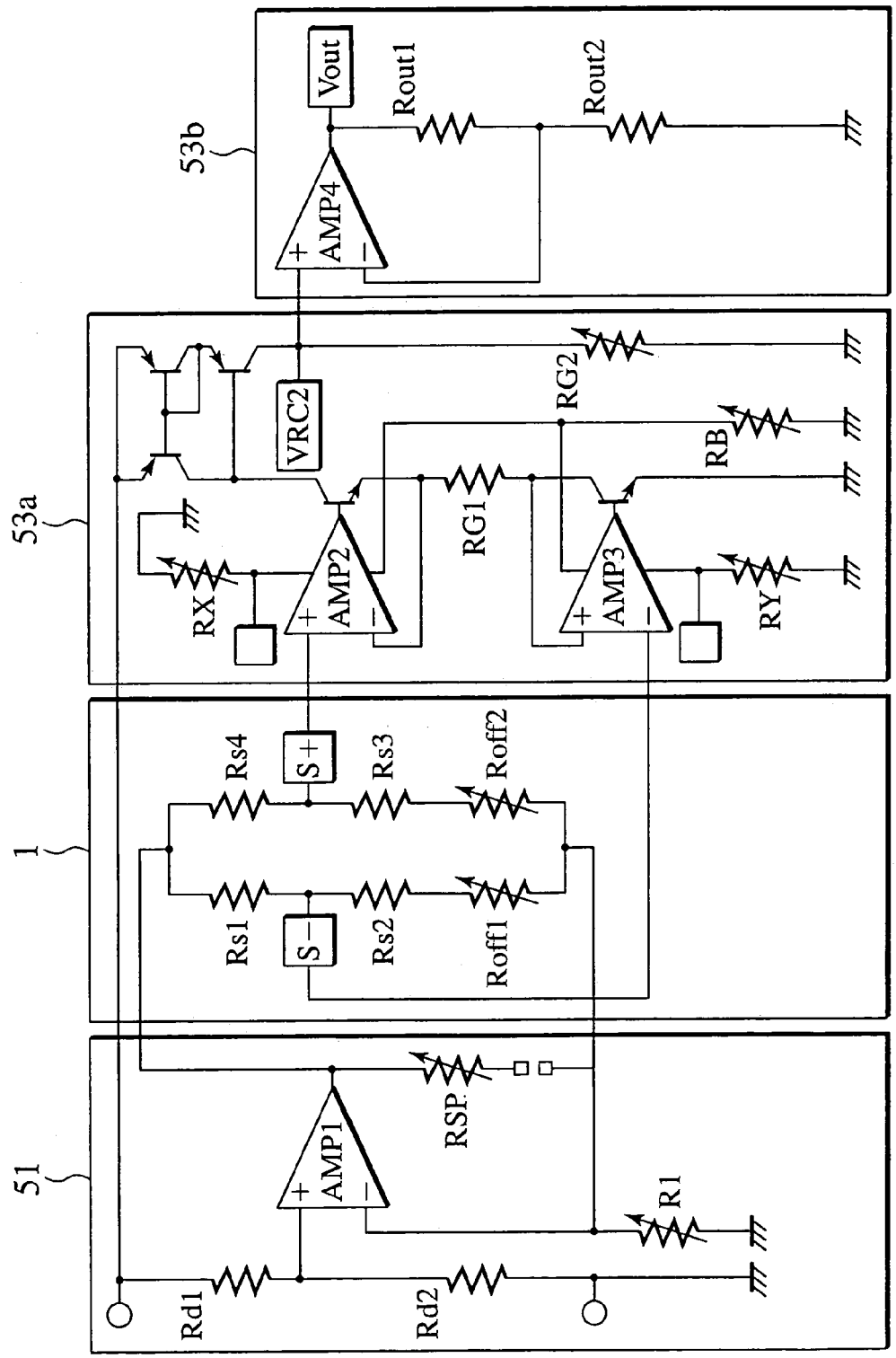
FIG. 15 is a circuit schematic diagram of the exemplary integrated pressure sensor.

In FIG. 15, power source circuit 51 includes an operational amplifier (AMP1) to drive a piezo-resistive gage bridge at a constant current.

The signal amplification circuit 55 includes a measurement amplification circuit 53a and an output amplification circuit 53b. The measurement amplification circuit 53a includes two operational amplifiers (AMP2, AMP3), and employs Wilson current miller circuit. The output amplification circuit 53b includes an operational amplifier (AMP4), and obtains an output voltage from a ground level to a voltage of a power source.

The temperature compensation circuit 55, achieves offset temperature compensation. Temperature drifts of the operational amplifiers (AMP2, AMP3) for measurement are controlled to regulate temperature drift characteristics of the operational amplifiers. This gives each operational amplifier an opposite temperature characteristic to offset temperature characteristics of pressure sensors (S). Driving of the pressure sensors (S) and connecting of resistance (RSP) parallel to the bridge achieve sensitive temperature compensation.

An offset regulation circuit 57 includes resistances (Roff1, Roff2) regulated by a laser trimming.

Although the invention has been described above by reference to exemplary embodiments of the invention, the invention is not limited to the exemplary embodiments described above. Modifications and variations of the embodiments described above may occur to those skilled in the art, in light of the above teachings. The scope of the invention is defined with reference to the following claims.

What is claimed is:

1. A semiconductor pressure sensor comprising:
   a substrate comprising:
   a first surface and a second surface opposite to the first surface;
   a diaphragm formed in the substrate and arranged to be displaceable by a pressure medium acting on the first surface of the substrate;
   a sensor arranged on the second surface of the substrate to detect displacement of the diaphragm;
   a support arranged adjacent to the second surface of the substrate,
   wherein a portion of a first surface of the support is joined to the second surface of the substrate, and another portion of the first surface opposed to the sensor is offset from the sensor in a direction orthogonal to the first surface.

2. The semiconductor pressure sensor recited in claim 1 wherein the offset portion of the first surface of the support is formed by a recess in the support.

3. The semiconductor pressure sensor recited in claim 2, wherein the sensor is arranged between the diaphragm and the offset portion of the first surface of the support.

4. The semiconductor pressure sensor recited in claim 1, wherein the support is hermetically sealed to the substrate.

5. The semiconductor pressure sensor recited in claim 1 wherein the support includes a through-hole interconnection for outputting a signal from the sensor.

6. The semiconductor pressure sensor recited in claim 5, wherein the through-hole interconnection comprises:
   a through-hole extending from the first surface of the support to a second surface of the support;
   a conductive material filled in the through-hole; and
   a conductive connector arranged on the second surface of the support and connected to the conductive material.

7. The semiconductor pressure sensor recited in claim 6, wherein the conductive connector comprises a bump.

8. The semiconductor pressure sensor recited in claim 6, wherein the conductive connector comprises a pad.

9. The semiconductor pressure sensor recited in claim 5, wherein the through-hole interconnection is electrically connected to a metal pad arranged between the substrate and the support.

10. The semiconductor pressure sensor recited in claim 9, wherein a diameter of metal pad arranged between the substrate and the support is greater than a diameter of the through-hole.

11. The semiconductor pressure sensor recited in claim 5, further comprising a sealing metal arranged between the substrate and the support,
    wherein the sealing metal is arranged laterally outside the through-hole interconnection, relative to the sensor.

12. The semiconductor pressure sensor of claim 11, wherein the sealing metal is arranged along a periphery of the offset portion and forms a hermetic seal between the substrate and support.

13. The semiconductor pressure sensor recited in claim 5, further comprising a sealing metal arranged between the substrate and the support,
    wherein the sealing metal is arranged laterally inside the through-hole interconnection, relative to the sensor.

14. The semiconductor pressure sensor of claim 13, wherein the sealing metal is arranged along a periphery of the offset portion and forms a hermetic seal between the substrate and support.

15. The semiconductor pressure sensor recited in claim 1 wherein the substrate includes a through-hole interconnection for outputting a signal from the sensor.

16. The semiconductor pressure sensor recited in claim 15, wherein the through-hole interconnection comprises:
    a through-hole extending from the first surface of the substrate to the second surface of the substrate;
    a conductive material filled in the through-hole; and
    a conductive connector arranged on the first surface of the substrate and connected to the conductive material.

17. The semiconductor pressure sensor recited in claim 16, wherein the conductive connector comprises a bump.

18. The semiconductor pressure sensor recited in claim 16, wherein the conductive connector comprises a pad.

19. The semiconductor pressure sensor recited in claim 15, wherein the through-hole interconnection is electrically connected to a metal pad arranged between the substrate and the support.

20. The semiconductor pressure sensor recited in claim 19, wherein a diameter of metal pad arranged between the substrate and the support is greater than a diameter of the through-hole.

21. The semiconductor pressure sensor recited in claim 15, further comprising a sealing metal arranged between the substrate and the support,
    wherein the sealing metal is arranged laterally outside the through-hole interconnection, relative to the sensor.

22. The semiconductor pressure sensor of claim 21, wherein the sealing metal is arranged along a periphery of the offset portion and forms a hermetic seal between the substrate and support.

23. The semiconductor pressure sensor recited in claim 15, further comprising a sealing metal arranged between the substrate and the support,
    wherein the sealing metal is arranged laterally inside the through-hole interconnection, relative to the sensor.

24. The semiconductor pressure sensor of claim 23, wherein the sealing metal is arranged along a periphery of the offset portion and forms a hermetic seal between the substrate and support.

25. The semiconductor pressure sensor of claim 15, wherein the substrate further comprises an outer insulation film formed on the first surface thereof and on inner walls of the through-hole.

26. The semiconductor pressure sensor recited in claim 1 further comprising an insulation layer arranged between the substrate and the support.

27. The semiconductor pressure sensor recited in claim 1 further comprising a sealing metal arranged between the substrate and the support.

28. The semiconductor pressure sensor of claim 27, wherein the sealing metal is arranged along a periphery of the offset portion and forms a hermetic seal between the substrate and support.

29. The semiconductor pressure sensor recited in claim 1, wherein the substrate comprises a silicon chip.

30. The semiconductor pressure sensor recited in claim 1 wherein the support comprises a glass support.

31. The semiconductor pressure sensor recited in claim 1, wherein the sensor comprises a piezo-resistive element.

32. The semiconductor pressure sensor recited in claim 1, wherein the substrate has a first thickness; and the diaphragm comprises a portion of the substrate that has a second thickness thinner than the first thickness.

33. The semiconductor pressure sensor recited in claim 1 wherein the offset portion of the first surface of the support and the second surface of the substrate define a space therebetween.

34. The semiconductor pressure sensor recited in claim 1 wherein the substrate and the support are joined together by anodic bonding.

35. The semiconductor pressure sensor recited in claim 1 wherein the substrate and the support are joined together by an adhesive layer arranged therebetween.

36. A method of forming a semiconductor pressure sensor comprising:
forming a silicon substrate comprising a first and second surface;
forming a diaphragm in the first surface of the substrate so that it is displaceable by a pressure medium acting on the first surface of the substrate;
forming a sensor on the second surface of the silicon substrate to detect displacement of the diaphragm;
forming a glass support having a first and second surface:
forming a recess in the first surface of the glass; and
joining the glass support to the silicon substrate so that the recess is arranged adjacent to the piezo-resistive element to form a space therebetween.

37. A method of forming a semiconductor pressure sensor as recited in claim 36, wherein the glass support is hermetically sealed to the silicon substrate.

38. A method of forming a semiconductor pressure sensor as recited in claim 36, wherein the step of forming the diaphragm in the silicon substrate is performed before the step of joining the glass support to the silicon substrate.

39. A method of forming a semiconductor pressure sensor as recited in claim 36, wherein the step of forming the diaphragm in the silicon substrate is performed after the step of joining the glass support to the silicon substrate.

40. A method of forming a semiconductor pressure sensor as recited in claim 36, wherein a through hole is formed in the glass support, extending from the first surface to the second surface thereof.

41. A method of forming a semiconductor pressure sensor as recited in claim 40, wherein a conductive material is filled in the through hole, and a conductive connector is formed on the second surface of the glass support.

42. A method of forming a semiconductor pressure sensor as recited in claim 41, wherein the conductive connector comprises a bump.

43. A method of forming a semiconductor pressure sensor as recited in claim 41, wherein the conductive connector comprises a pad.

44. A method of forming a semiconductor pressure sensor as recited in claim 40, further comprising:
forming a sealing metal on the second surface of the silicon substrate,
wherein the sealing metal is arranged laterally outside the through hole, relative to the sensor.

45. A method of forming a semiconductor pressure sensor as recited in claim 40, further comprising:
forming a sealing metal on the second surface of the silicon substrate,
wherein the sealing metal is arranged laterally inside the through hole, relative to the sensor.

46. A method of forming a semiconductor pressure sensor as recited in claim 36, wherein a through hole is formed in the silicon substrate, extending from the first surface to the second surface thereof.

47. A method of forming a semiconductor pressure sensor as recited in claim 46, wherein a conductive material is filled in the through hole, and a conductive connector is formed on the first surface of the silicon substrate.

48. A method of forming a semiconductor pressure sensor as recited in claim 47, wherein the conductive connector comprises a bump.

49. A method of forming a semiconductor pressure sensor as recited in claim 47, wherein the conductive connector comprises a pad.

50. A method of forming a semiconductor pressure sensor as recited in claim 46, further comprising:
forming a sealing metal on the second surface of the silicon substrate,
wherein the sealing metal is arranged laterally outside the through hole, relative to the sensor.

51. A method of forming a semiconductor pressure sensor as recited in claim 46, further comprising:
forming a sealing metal on the second surface of the silicon substrate,
wherein the sealing metal is arranged laterally inside the through hole, relative to the sensor.

52. A method of forming a semiconductor pressure sensor as recited in claim 36, further comprising forming an insulation film on the second surface of the silicon substrate.

53. A method of forming a semiconductor pressure sensor as recited in claim 52, further comprising forming an opening in the insulation film.

54. A method of forming a semiconductor pressure sensor as recited in claim 52, wherein the sensor is a piezo-resistive element formed beneath the insulation film.

55. A method of forming a semiconductor pressure sensor as recited in claim 52, further comprising forming a high-concentration lead part beneath the insulation film.

56. A method of forming a semiconductor pressure sensor as recited in claim 36, further comprising forming a metal pad and a sealing metal on the second surface of the silicon substrate.

57. A method of forming a semiconductor pressure sensor as recited in claim 36, wherein the glass support is joined to the silicon substrate by anodic bonding.

58. A method of forming a semiconductor pressure sensor as recited in claim 36, wherein the glass support is joined to the silicon substrate by an interposed adhesive layer.

59. A method of forming a semiconductor pressure sensor as recited in claim 36, wherein the sensor is arranged between the diaphragm and recess.

* * * * *